(12) United States Patent
Jain et al.

(10) Patent No.: US 11,271,475 B2
(45) Date of Patent: Mar. 8, 2022

(54) ON-PACKAGE HIGH-BANDWIDTH RESONANT SWITCHED CAPACITOR VOLTAGE REGULATOR

(71) Applicant: Intel Corporation, Santa Clara, CA (US)

(72) Inventors: Rinkle Jain, Portland, OR (US); Jonathan Douglas, Portland, OR (US); Shivadarshan Rajeurs, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 274 days.

(21) Appl. No.: 16/440,901

(22) Filed: Jun. 13, 2019

(65) Prior Publication Data
US 2020/0395845 A1 Dec. 17, 2020

(51) Int. Cl.
| | |
|---|---|
| *G11C 5/14* | (2006.01) |
| *H02M 3/07* | (2006.01) |
| *G06F 1/26* | (2006.01) |
| *H03K 3/037* | (2006.01) |

(52) U.S. Cl.
CPC .............. *H02M 3/07* (2013.01); *G06F 1/263* (2013.01); *H03K 3/037* (2013.01)

(58) Field of Classification Search
CPC ......... G11C 5/147; G05F 1/465; G05F 3/205; G05F 3/262; H04B 1/1623
USPC ....................................................... 327/530
See application file for complete search history.

(56) References Cited

U.S. PATENT DOCUMENTS

| | | | |
|---|---|---|---|
| 7,760,010 B2 | 7/2010 | Gebara et al. | |
| 8,289,074 B2 | 10/2012 | Yamamoto et al. | |
| 8,724,353 B1 | 5/2014 | Giuliano et al. | |
| 9,634,577 B2 | 4/2017 | Perreault | |
| 2013/0229841 A1* | 9/2013 | Giuliano | H02M 1/4225 363/60 |
| 2016/0190917 A1* | 6/2016 | Delos Ayllon | H05B 45/325 315/307 |

(Continued)

FOREIGN PATENT DOCUMENTS

| | | |
|---|---|---|
| KR | 20150131338 | 11/2015 |
| KR | 20160117675 | 10/2016 |

OTHER PUBLICATIONS

International Search Report and Written Opinion from PCT/US2020/032729 dated Aug. 27, 2020, 14 pgs.

*Primary Examiner* — Anh-Quan Tra
(74) *Attorney, Agent, or Firm* — Schwabe, Williamson & Wyatt, P.C.

(57) ABSTRACT

Disclosed is an N:1 (where N is an integer such as 3 or higher) resonant star topology converter to generate an input supply (e.g., 1.8V) for a processor (e.g., a system-on-chip (SOC)) from a higher power supply source (e.g., 12.6V) such as a battery or other source. The resonant star topology based regulator can be realized by a combination of on-die and on-package components as opposed to voltage regulators on motherboard with discrete inductor and capacitors. In one example, capacitors of the N:1 resonant star topology are implemented as multilayer ceramic capacitors (MLCC). The architecture of the N:1 resonant star topology based regulator results in high bandwidth. For example, compared to traditional step-down voltage regulators, the N:1 resonant star topology based regulator exhibits ten times higher bandwidth.

11 Claims, 9 Drawing Sheets

(56) References Cited

U.S. PATENT DOCUMENTS

2018/0097486 A1* 4/2018 Salem .................. H03F 3/2171
2019/0115830 A1* 4/2019 Giuliano ................ H02M 3/07

* cited by examiner

ON-PACKAGE HIGH-BANDWIDTH RESONANT SWITCHED CAPACITOR VOLTAGE REGULATOR

BACKGROUND

Voltage regulators are used extensively in a computer system. For example, supply voltage from a wall or a battery is first converted down by a step-down transformer or regulator to a supply level that can be input to a processor. In one example, multiple step-down voltage regulators are used to convert the battery or wall power supply to an input supply for a processor. Today, voltage regulators used for generating step-down regulated voltage are buck or buck derived DC-DC converters, with few hundreds of kHz (kilohertz) in bandwidth, and require large passive components that are assembled on a motherboard.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

DETAILED DESCRIPTION

Figure 1:
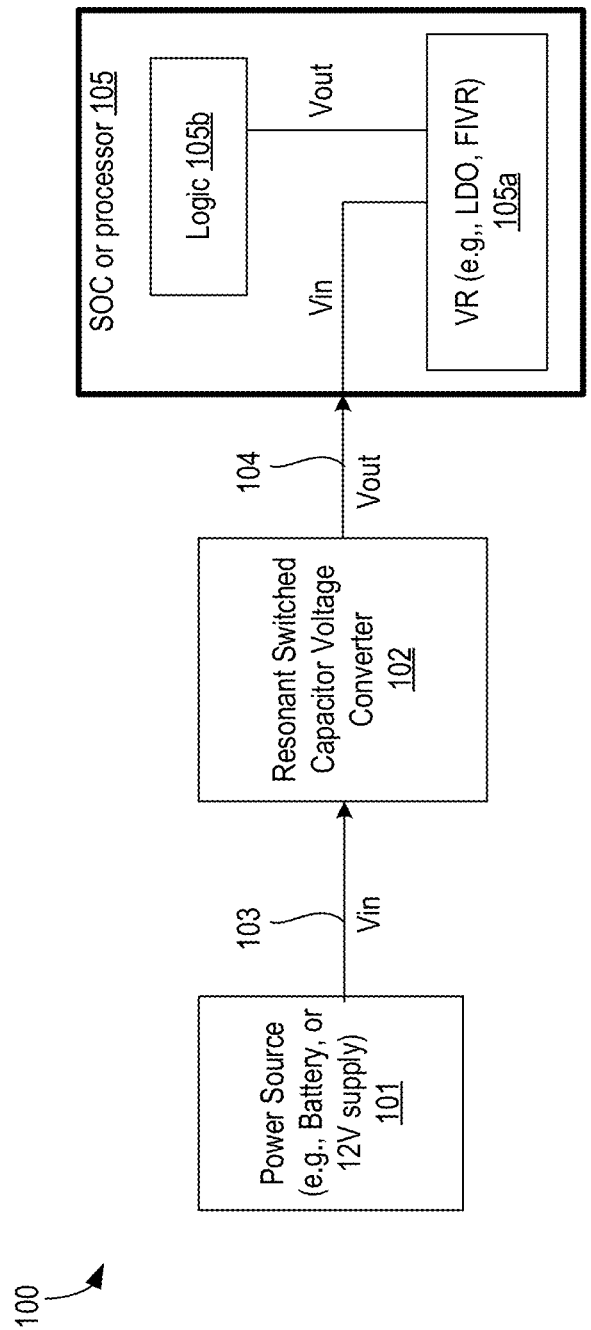
FIG. 1 illustrates a system with a resonant switched capacitor star topology to provide input power supply to a processor or system-on-chip, in accordance with some embodiments.

Some embodiments disclose an N:1 (where N is an integer such as 3 or higher) resonant star topology to generate an input supply (e.g., 1.8V) for a processor (e.g., a system-on-chip (SOC)) from a higher power supply source (e.g., 12.6V) such as a battery or other source. Traditional switched capacitor circuits suffer from charge-discharge losses. These losses are eliminated by parasitic inductance that enable high conversion efficiency.

The N:1 resonant star topology uses high self-resonant frequency capacitors and a small inductor which switches at, for example, 200 MHz. In some embodiments, the small inductor can be realized by parasitic inductance. The architecture of the N:1 resonant star topology allows for accommodating passive devices (e.g., capacitors) on a package. As such, the resonant star topology based regulator can be realized by a combination of on-die and on-package components as opposed to voltage regulators on motherboard with discrete inductor and capacitors. In some embodiments, the capacitors of the N:1 resonant star topology are implemented as multilayer ceramic capacitors (MLCC). In some embodiments, when N is a low number (e.g., 2, 3), the capacitors can be fabricated on-die. The architecture of the N:1 resonant star topology based regulator results in high bandwidth. For example, compared to traditional step-down voltage regulators, the N:1 resonant star topology based regulator exhibits ten times higher bandwidth. Other technical effects will be evident from the various embodiments and figures.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct connection, such as electrical, mechanical, or magnetic connection between the things that are connected, without any intermediary devices.

The term "coupled" means a direct or indirect connection, such as a direct electrical, mechanical, or magnetic connection between the things that are connected or an indirect connection, through one or more passive or active intermediary devices.

The term "adjacent" here generally refers to a position of a thing being next to (e.g., immediately next to or close to with one or more things between them) or adjoining another thing (e.g., abutting it).

The term "circuit" or "module" may refer to one or more passive and/or active components that are arranged to cooperate with one another to provide a desired function.

The term "signal" may refer to at least one current signal, voltage signal, magnetic signal, or data/clock signal. The meaning of "a," "an," and "the" include plural references. The meaning of "in" includes "in" and "on."

The term "scaling" generally refers to converting a design (schematic and layout) from one process technology to another process technology and may be subsequently being reduced in layout area. In some cases, scaling also refers to upsizing a design from one process technology to another process technology and may be subsequently increasing layout area. The term "scaling" generally also refers to downsizing or upsizing layout and devices within the same technology node. The term "scaling" may also refer to adjusting (e.g., slowing down or speeding up—i.e. scaling down, or scaling up respectively) of a signal frequency relative to another parameter, for example, power supply level. The terms "substantially," "close," "approximately," "near," and "about," generally refer to being within +/−10% of a target value.

Unless otherwise specified the use of the ordinal adjectives "first," "second," and "third," etc., to describe a common object, merely indicate that different instances of like objects are being referred to and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

The terms "left," "right," "front," "back," "top," "bottom," "over," "under," and the like in the description and in the claims, if any, are used for descriptive purposes and not necessarily for describing permanent relative positions.

It is pointed out that those elements of the figures having the same reference numbers (or names) as the elements of any other figure can operate or function in any manner similar to that described but are not limited to such.

For purposes of the embodiments, the transistors in various circuits and logic blocks described here are metal oxide semiconductor (MOS) transistors or their derivatives, where the MOS transistors include drain, source, gate, and bulk terminals. The transistors and/or the MOS transistor derivatives also include Tri-Gate and FinFET transistors, Gate All Around Cylindrical Transistors, Tunneling FET (TFET), Square Wire, or Rectangular Ribbon Transistors, ferroelectric FET (FeFETs), or other devices implementing transistor functionality like carbon nanotubes or spintronic devices. MOSFET symmetrical source and drain terminals i.e., are identical terminals and are interchangeably used here. A TFET device, on the other hand, has asymmetric Source and Drain terminals. Those skilled in the art will appreciate that other transistors, for example, Bi-polar junction transistors (BJT PNP/NPN), BiCMOS, CMOS, etc., may be used without departing from the scope of the disclosure.

FIG. 1 illustrates system 100 with a resonant switched capacitor star topology to provide input power supply to a processor or system-on-chip, in accordance with some embodiments. System 100 comprises power source 101 (e.g., battery or 12.6 V supply), N:1 resonant switch capacitor voltage converter (e.g., 7:1 resonant switched capacitor star topology), and load (e.g., processor of SOC 105). Power source 101 provides input power supply voltage Vin on supply rail 103 to converter 102. This input power supply voltage Vin is then dropped down to, for example, 1.8V, and provided as regulated output power supply Vout on output supply rail 104 by converter 102. Vout is then used as input supply Vin by load (e.g., processor 105 or SOC). The input supply is received by a regulator such as low-dropout regulator (LDO) or fully integrated switching voltage regulator (FIVR) 105a and a regulated output supply Vout is provided to one or more power domains of processor 105. These power domains may include logic 105b such as processor core, cache, I/O circuits, etc.

Figure 2:
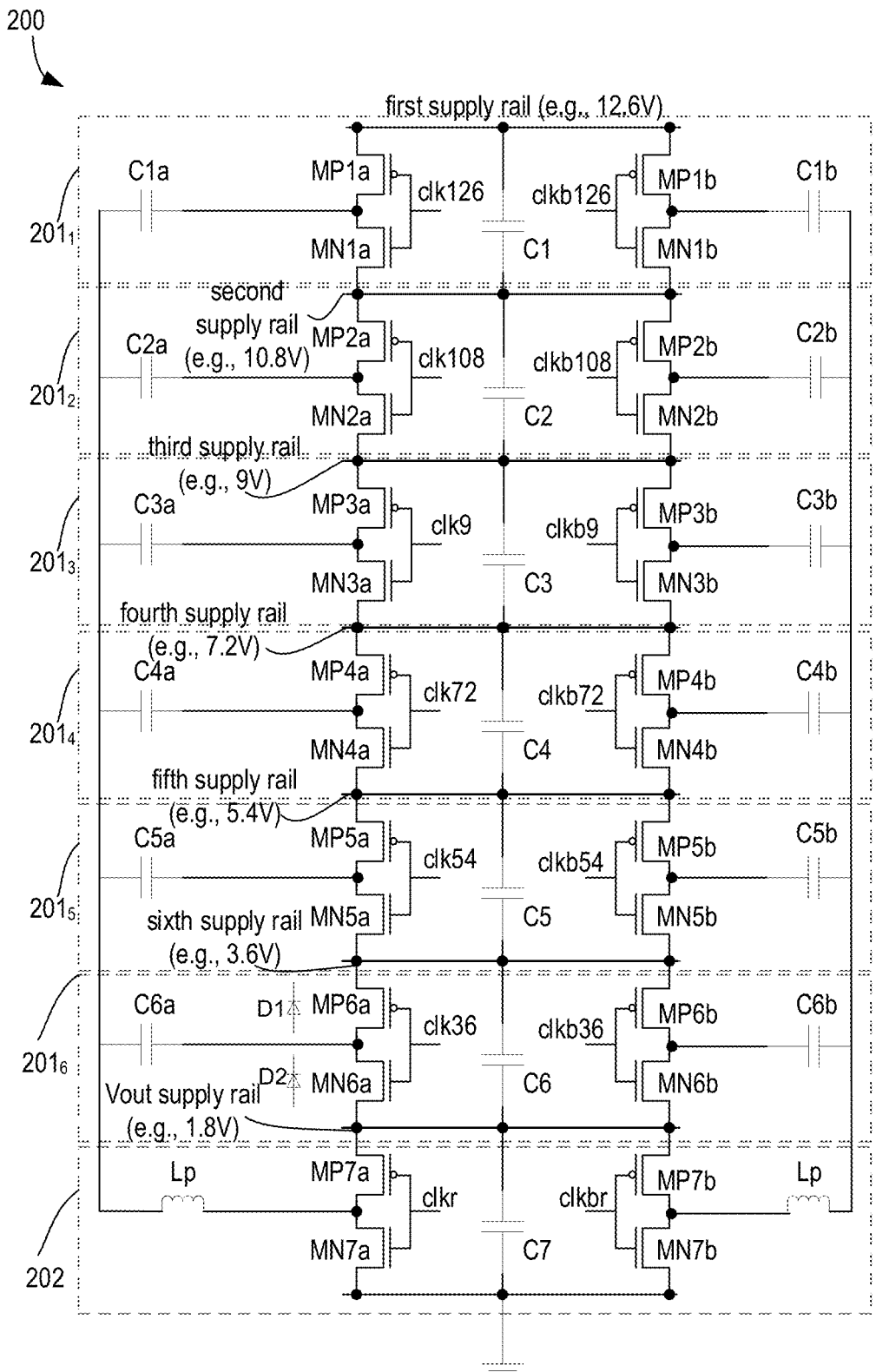
FIG. 2 illustrates a 7:1 resonant switched capacitor star topology, according to some embodiments of the disclosure.

FIG. 2 illustrates an N:1 resonant switched capacitor star topology 200, according to some embodiments of the disclosure. In this example, N=7. However, depending on the input supply voltage and the desired output supply voltage, N can be a different number. In some embodiments, 7:1 resonant switched capacitor star topology 200 comprises input sections or sending ends 201. In this example, six input sections $201_{1-6}$ are shown that are coupled together in a ladder formation. Each section or step of the ladder configuration comprises first and second inverters and a capacitor coupled between two different power supply rails. The output of each inverter is also coupled to a corresponding capacitor. In some embodiments, the devices (e.g., transistors of the inverters) are fabricated on a thick gate process. The thick gate allows for the transistors to operate at a high gate voltage (e.g., 1.8V). In other embodiments, other types of process techniques may be used for providing devices that can operate or handle high voltages such as 1.8V. In some embodiments, the capacitor(s) between the power supply rails are implemented as on-die capacitors.

For example, capacitors C1-C7 are implemented as metal-insulator-metal (MIM) capacitors, metal capacitors, ferro-electric capacitors, transistor based capacitors, or a combination of them. These on-die capacitors C1-C7 are formed on the same die as the transistors of the various logic of the N:1 resonant switched capacitor star topology 200.

In some embodiments, the n-type transistors of the inverters sit in a P-Well (PW) within a Deep N-Well (DNW). In some embodiments, the p-type transistors of the inverters sit in an N-Well (NW) within the DNW. For each section of the ladder, the NW/PW and the DNW are biased to the power supply rail which provides the higher voltage in that section. Here, parasitic anti-parallel diodes are enabled with the FETs (field-effect transistor) as shown for freewheeling paths allowing for phase shift control. In various embodiments, the n-type and p-type device of the ladder, whose source regions are tied to a ladder node, may also share a DNW which is biased at the ladder voltages.

The first input section 201k comprises first and second inverters and a capacitor C1 coupled to first power supply rail (e.g., a rail that provides 12.6V from battery or power source 101) and a second power supply rail (e.g., a rail that provides 10.8V). The first inverter comprises p-type transistor MP1a and an n-type transistor MN1a coupled in series. The second inverter comprises p-type transistor MP1b and an n-type transistor MN1b coupled in series. The first inverter is controllable by switching signal clk126 (e.g., a clock) while the second inverter is controllable by switching signal clkb126, wherein clk126 is an inverse of clkb126. Switching signals clk126 and clkb126 toggle between the voltages of the first and second supply rails. For example, clk126 and clkb126 toggle between 12.6V and 10.8V. The output of the first inverter is coupled to a first terminal of capacitor C1a while the output of the second inverter is coupled to a first terminal of capacitor C1b.

The second input section $201_2$ comprises first and second inverters and a capacitor C2 coupled to the second power supply rail (e.g., a rail that provides 10.8V) and a third power supply rail (e.g., a rail that provides 9V). The first inverter of the second section $201_2$ comprises p-type transistor MP2a and an n-type transistor MN2a coupled in series. The second inverter comprises p-type transistor MP2b and an n-type transistor MN2b coupled in series. The first inverter is controllable by switching signal clk108 (e.g., a clock) while the second inverter is controllable by switching signal clkb108, wherein clk108 is an inverse of clkb108. Switching signals clk108 and clkb108 toggle between the voltages of the second and third supply rails. For example, clk108 and clkb108 toggle between 10.8V and 9V. The output of the first inverter is coupled to a first terminal of capacitor C2a while the output of the second inverter is coupled to a first terminal of capacitor C2b.

The third input section $201_3$ comprises first and second inverters and a capacitor C3 coupled to the third power supply rail (e.g., a rail that provides 9V) and a fourth power supply rail (e.g., a rail that provides 7.2V). The first inverter of the second section $201_3$ comprises p-type transistor MP3a and an n-type transistor MN3a coupled in series. The second inverter comprises p-type transistor MP3b and an n-type transistor MN3b coupled in series. The first inverter is controllable by switching signal clk9 (e.g., a clock) while the second inverter is controllable by switching signal clkb9, wherein clk9 is an inverse of clkb9. Switching signals clk9 and clkb9 toggle between the voltages of the third and fourth supply rails. For example, clk9 and clkb9 toggle between 9V and 7.2V. The output of the first inverter is coupled to a first terminal of capacitor C3a while the output of the second inverter is coupled to a first terminal of capacitor C3b.

The fourth input section $201_4$ comprises first and second inverters and a capacitor C4 coupled to the fourth power supply rail (e.g., a rail that provides 7.2V) and a fifth power supply rail (e.g., a rail that provides 5.4V). The first inverter of the second section 2014 comprises p-type transistor MP4a and an n-type transistor MN4a coupled in series. The second inverter comprises p-type transistor MP4b and an n-type transistor MN4b coupled in series. The first inverter is controllable by switching signal clk72 (e.g., a clock) while the second inverter is controllable by switching signal clkb72, wherein clk72 is an inverse of clkb72. Switching signals clk72 and clkb72 toggle between the voltages of the fourth and fifth supply rails. For example, clk72 and clkb72 toggle between 7.2V and 5.4V. The output of the first inverter is coupled to a first terminal of capacitor C4a while the output of the second inverter is coupled to a first terminal of capacitor C4b.

The fifth input section $201_5$ comprises first and second inverters and a capacitor C5 coupled to the fifth power supply rail (e.g., a rail that provides 5.4V) and a sixth power supply rail (e.g., a rail that provides 3.6V). The first inverter of the second section $201_5$ comprises p-type transistor MP5a and an n-type transistor MN5a coupled in series. The second inverter comprises p-type transistor MP5b and an n-type transistor MN4b coupled in series. The first inverter is controllable by switching signal clk54 (e.g., a clock) while the second inverter is controllable by switching signal clkb54, wherein clk54 is an inverse of clkb54. Switching signals clk54 and clkb54 toggle between the voltages of the firth and sixth supply rails. For example, clk54 and clkb54 toggle between 5.4V and 3.6V. The output of the first inverter is coupled to a first terminal of capacitor C5a while the output of the second inverter is coupled to a first terminal of capacitor C5b.

The sixth input section $201_6$ comprises first and second inverters and a capacitor C6 coupled to the sixth power supply rail (e.g., a rail that provides 3.6V) and a seventh power supply rail (e.g., a rail that provides 1.8V output voltage). The first inverter of the second section $201_6$ comprises p-type transistor MP6a and an n-type transistor MN6a coupled in series. The second inverter comprises p-type transistor MP6b and an n-type transistor MN6b coupled in series. The first inverter is controllable by switching signal clk36 (e.g., a clock) while the second inverter is controllable by switching signal clkb36, wherein clk36 is an inverse of clkb36. Switching signals clk36 and clkb36 toggle between the voltages of the sixth and seventh supply rails. For example, clk36 and clkb36 toggle between 3.6V and 1.8V. The output of the first inverter is coupled to a first terminal of capacitor C6a while the output of the second inverter is coupled to a first terminal of capacitor C6b.

In various embodiments, the last input section in the ladder, this example, section $201_6$, is coupled to an output section or receiving end 202. The output section 202 comprises first and second inverters and a capacitor C7 coupled to the seventh power supply rail (e.g., a rail that regulated output voltage Vout of 1.8V) and a ground power supply rail. The first inverter of the output section 202 comprises p-type transistor MP7a and an n-type transistor MN7a coupled in series. The second inverter comprises p-type transistor MP7b and an n-type transistor MN7b coupled in series. The first inverter is controllable by switching signal clkr (e.g., a clock) while the second inverter is controllable by switching signal clkbr, wherein clkr is an inverse of clkbr. Switching signals clkr and clkbr toggle between the voltages of the Vout and ground supply rails. For example, clkr and clkbr toggle between 1.8V and 0V. The output of the first inverter is coupled to the second terminals of capacitors C1a, C2a, C32, C4a, C5a, and C6a. The output of the second inverter is coupled to the second terminals of capacitors C1a, C2a, C32, C4a, C5a, and C6a. Here, Lp is the parasitic inductance that enables high conversion efficiency.

In various embodiments, switching signals clk126, clk108, clk9, clk72, clk54, clk36 and their complementary switching signals clkb126, clkb108, clkb9, clkb72, clkb54, clkb36, respectively, are generated by a level-shifter. The signal swing of these switching signals in this example is 1.8V. In other examples, other voltage levels for the power supply rails can be used and the difference in those voltages (that determines the signal swing of the switching signals) is such that can be tolerated by the inverter transistors. The N:1 resonant switched capacitor star topology 200 is the driver side of the regulator. A person skilled in the art would appreciate that other components such as switching signal generators, control loop from Vout to a feedback system that adjusts phase of clkr and clkbr, are not shown but are present. By adjusting the phases of clkr and clkbr relative to other switching signals (e.g., clk126, clk108, clk9, clk72, clk54, clk36 and their complementary switching signals clkb126, clkb108, clkb9, clkb72, clkb54, clkb36, respectively), Vout is adjusted.

While FIG. 2 is described with reference to N=7, in some embodiments, when N is a low number (e.g., 2, 3), all passives (e.g., capacitors) can be fabricated entirely on-die.

Figure 3:
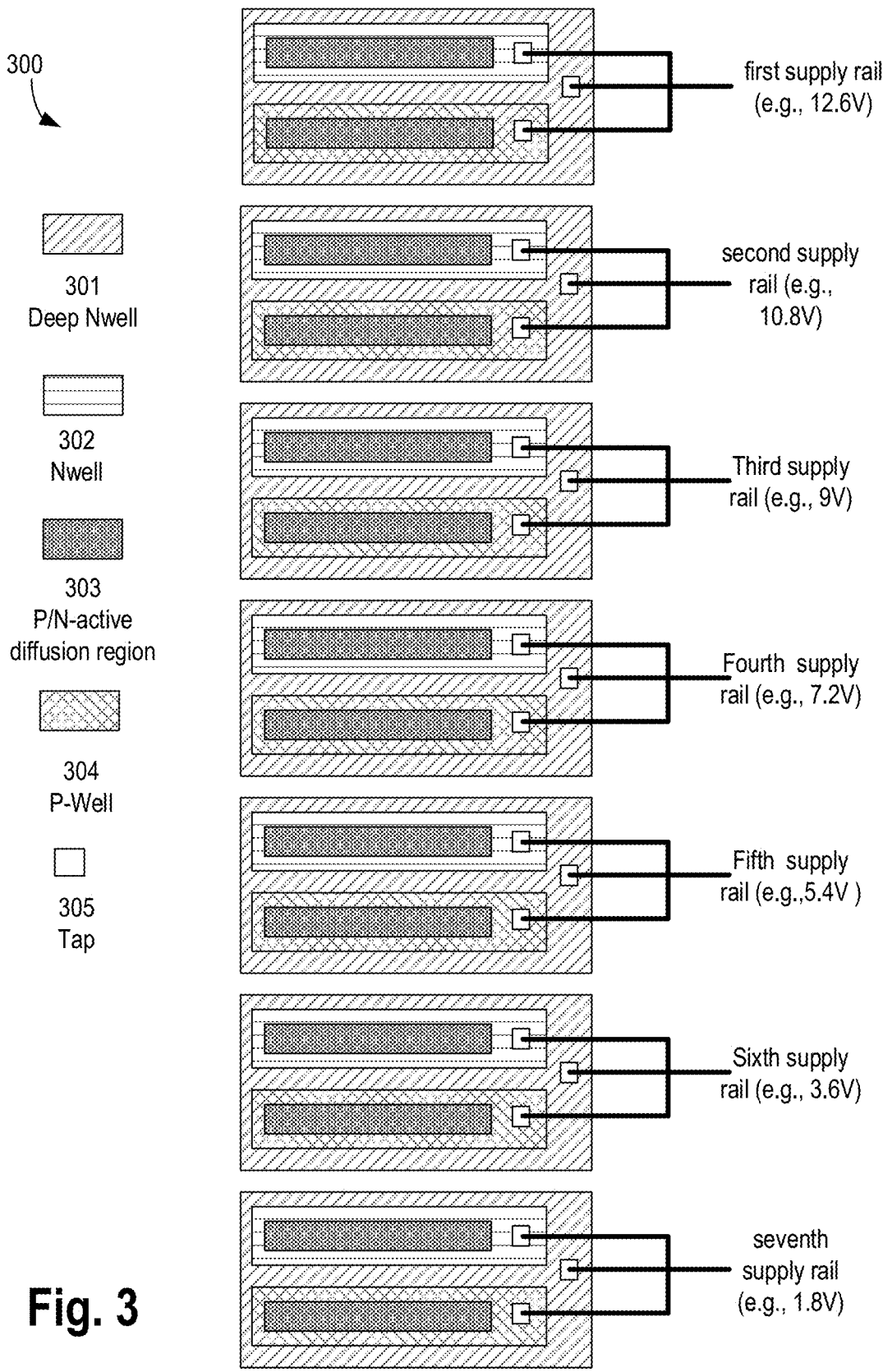
FIG. 3 illustrates layout of the active devices of the 7:1 resonant switched capacitor star topology, in accordance with some embodiments.

FIG. 3 illustrates layout 300 of the active devices of the 7:1 resonant switched capacitor star topology, in accordance with some embodiments. Layout 300 shows replication of cells that form the active devices of the ladder section. The n-type devices of the inverters of the ladder sit in a P-Well (PW) 304 within a Deep N-Well (DNW) 301. In some embodiments, the p-type transistors of the inverters sit in an N-Well (NW) 302 within DNW 301. The p-active and n-active diffusion regions are indicated by pattern 303. For each section of the ladder, DNW 301 and NW/PW 302/304 are biased to the power supply rail via taps 305 which provides the higher voltage in that section. In various embodiments, the n-type and p-type device of the ladder, whose source regions are tied to a ladder node, may also share a DNW which is biased at the ladder voltages. In various embodiments, matching of devices is achieved by using identical layout cells as shown.

Figure 4:
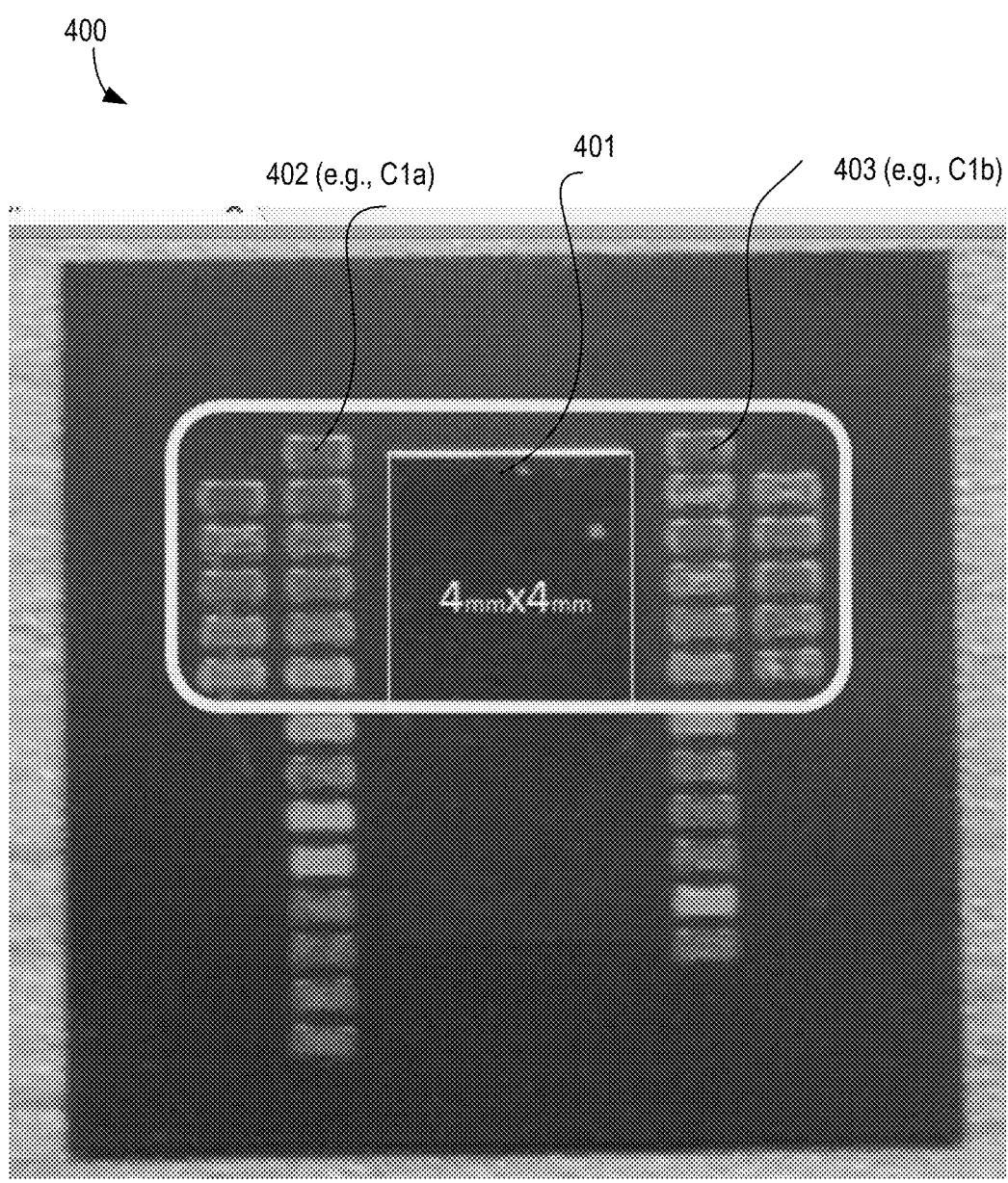
FIG. 4 illustrates a top view of a die comprising switching transistors and off-die capacitors for the 6:1 resonant switched capacitor star topology, in accordance with some embodiments.

FIG. 4 illustrates top view 400 of a die comprising switching transistors and off-die capacitors for the 6:1 resonant switched capacitor star topology, in accordance with some embodiments. The active devices 401 are fabricated in the center while capacitors C2a, C3a, C4a, C5a, and C6a, which are shown as 402, capacitors C2b, C3b, C4b, C5b, and C6b, which are shown as 403, are positioned on either sides of 401. Capacitors C2-C7 are also positioned outside of the active devices, in this example. The capacitors can be positioned on package, in accordance with some embodiments. Since this example is a 6:1, the first power supply rail provides 10.8V.

Figure 5:
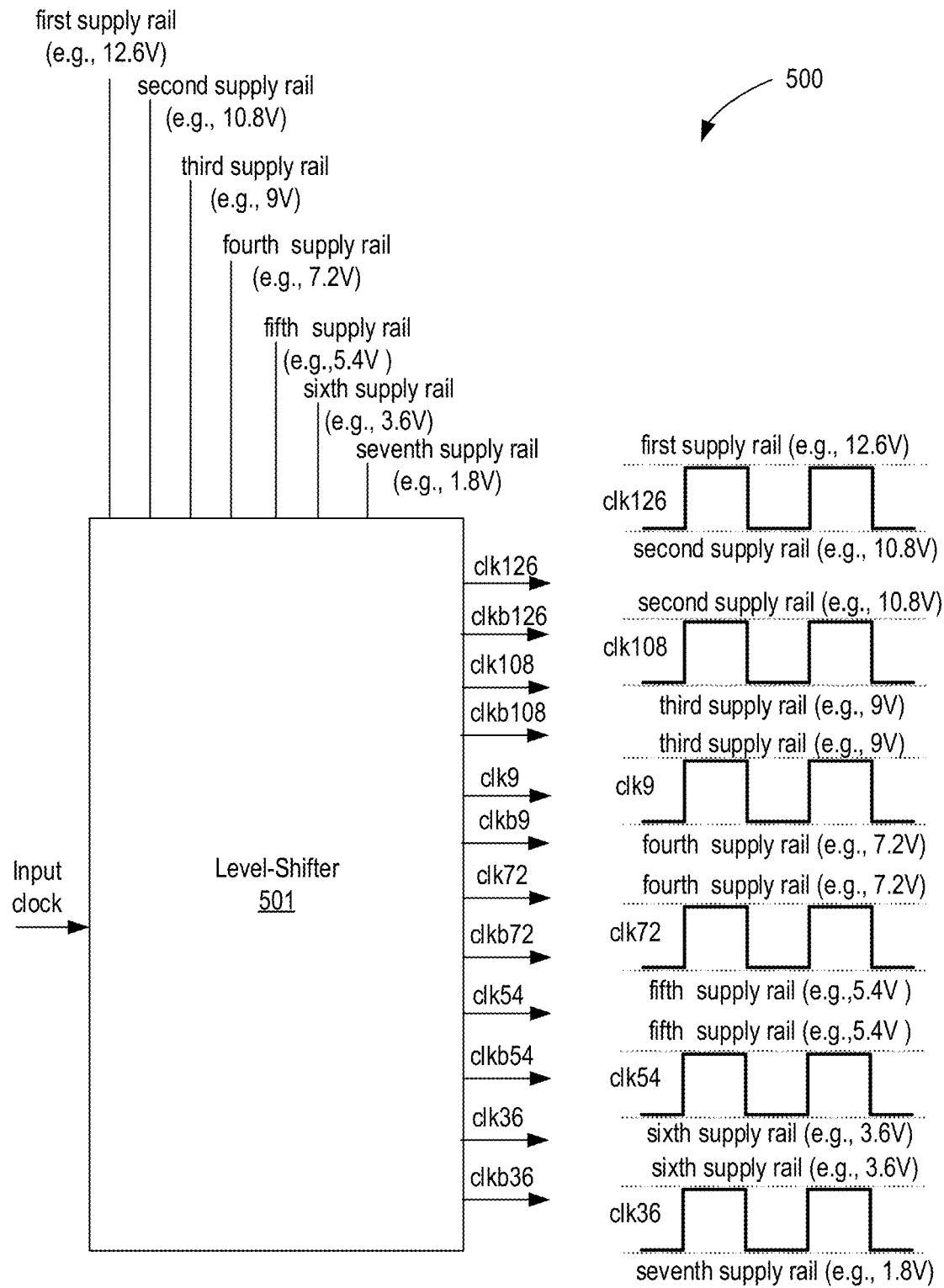
FIG. 5 illustrates a functional view of a level-shifter to generate switching control signals for the active devices of the 7:1 resonant switched capacitor star topology, according to some embodiments of the disclosure.

FIG. 5 illustrates a functional view 500 of a level-shifter to generate switching control signals for the active devices of the 7:1 resonant switched capacitor star topology, according to some embodiments of the disclosure. In various embodiments, switching signals are generated by level-shifter 501 that receives an input clock or an input switching signal, and the various power supplies (e.g., first, second, third, fourth, fifth, sixth, and seventh power supply rails), and generates switching signals that toggle between voltages of certain power supply rails such that the rail-to-rail swing for each switching signal is the same (e.g., 1.8V). Here, switching signals clk126, clk108, clk9, clk72, clk54, clk36 and their complementary switching signals clkb126, clkb108, clkb9, clkb72, clkb54, clkb36, respectively, are generated by level-shifter 501. In some embodiments, the phases of each switching signal is aligned. For example, the phases of switching signals clk126, clk108, clk9, clk72, clk54, and clk36 are aligned with one another, while phases of switching signals clkb126, clkb108, clkb9, clkb72, clkb54, and clkb36 are aligned with one another.

Figure 6:
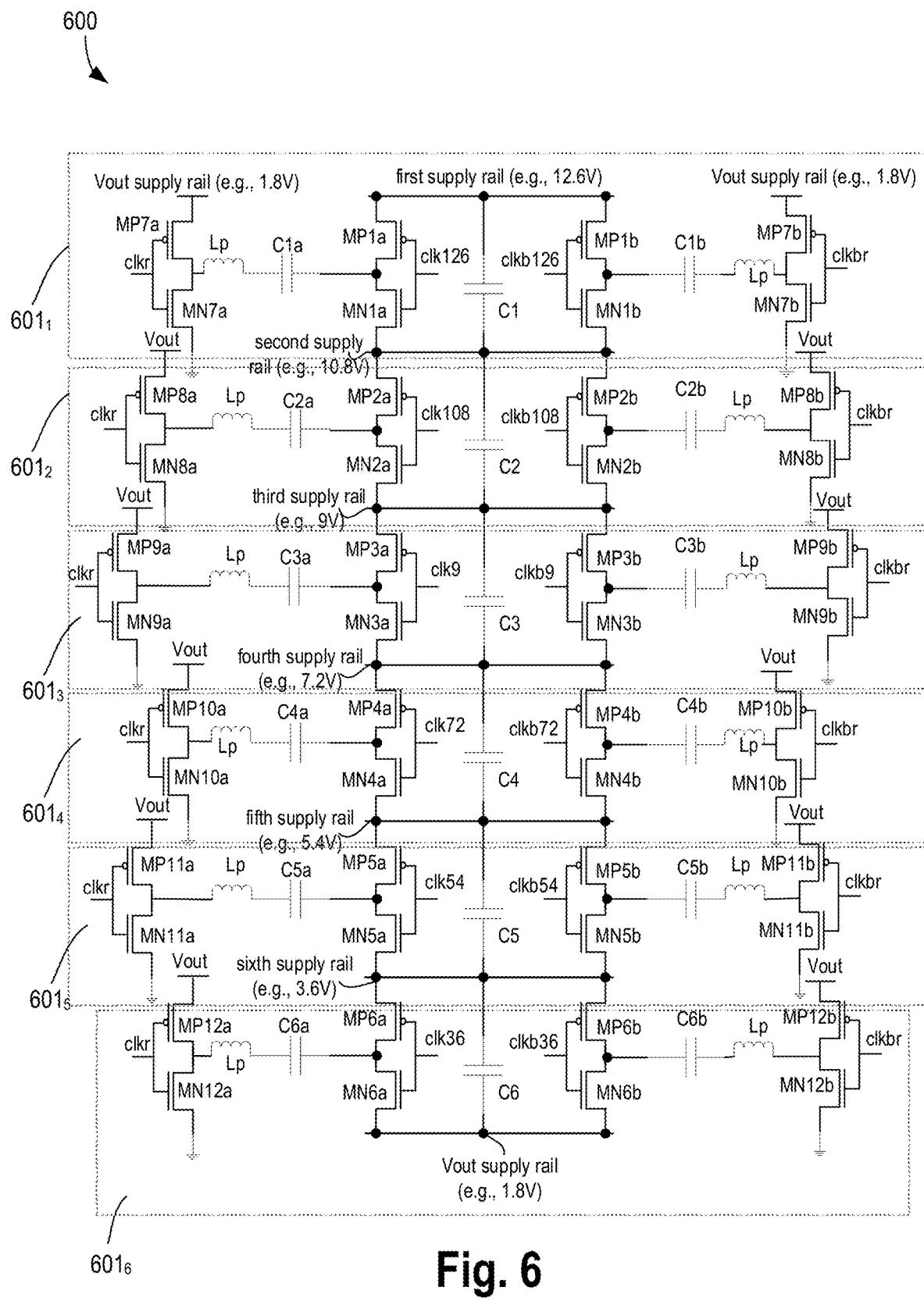
FIG. 6 illustrates a 7:1 resonant switched capacitor star topology with distributed receiving end, according to some embodiments of the disclosure.

FIG. 6 illustrates 7:1 resonant switched capacitor star topology 600 with distributed receiving end, according to some embodiments of the disclosure. Topology 600 is functionally equivalent to topology 200, but results in better matching in layout. Here, the receiving end section 202 is split and distributed to each section of the ladder. In this example, six ladder sections $601_1$ through $601_6$ are shown. However, for N:1 resonant switched capacitor star topology, the ladder will have N sections. In some embodiments, the inverters of section 202 are split and coupled to the second terminals of capacitors C1a through C6a, and capacitors C1b though capacitors C6b as shown. Here, Lp is the parasitic inductance. In this embodiment, instead of coupling the second terminals of capacitors C1a, C2a, C3a, C4a, C5a, and C6a, the second terminal of each of those capacitors is coupled to a split version of the first inverter of section 202. Likewise, instead of coupling the second terminals of capacitors C1b, C2b, C3b, C4b, C5b, and C6b, the second terminal of each of those capacitors is coupled to a split version of the second inverter of section 202.

For example, in section $601_1$, input of a first inverter of the receiving end comprising transistors MP7a and MN7a that is controlled by clock signal clkr is coupled to the second terminal of capacitor C1a; in section $601_2$, input of a first inverter of the receiving end comprising transistors MP8a and MN8a that is controlled by clock signal clkr is coupled to the second terminal of capacitor C2a; in section $601_3$, input of a first inverter of the receiving end comprising transistors MP9a and MN9a that is controlled by clock signal clkr is coupled to the second terminal of capacitor C3a; in section $601_4$, input of a first inverter of the receiving end comprising transistors MP10a and MN10a that is controlled by clock signal clkr is coupled to the second terminal of capacitor C4a; in section $601_5$, input of a first inverter of the receiving end comprising transistors MP11a and MN11a that is controlled by clock signal clkr is coupled to the second terminal of capacitor C5a; and in section $601_5$, input of a first inverter of the receiving end comprising transistors MP12a and MN12a that is controlled by clock signal clkr is coupled to the second terminal of capacitor C6a.

Continuing with this example, in section $601_1$, input of a second inverter of the receiving end comprising transistors MP7b and MN7b that is controlled by clock signal clkbr is coupled to the second terminal of capacitor C1b; in section $601_2$, input of a second inverter of the receiving end comprising transistors MP8b and MN8b that is controlled by clock signal clkbr is coupled to the second terminal of capacitor C2b; in section $601_3$, input of a second inverter of the receiving end comprising transistors MP9b and MN9b that is controlled by clock signal clkbr is coupled to the second terminal of capacitor C3b; in section $601_4$, input of a second inverter of the receiving end comprising transistors MP10b and MN10b that is controlled by clock signal clkbr is coupled to the second terminal of capacitor C4b; in section $601_5$, input of a second inverter of the receiving end comprising transistors MP11b and MN11b that is controlled by clock signal clkbr is coupled to the second terminal of capacitor C5b; and in section $601_5$, input of a second inverter of the receiving end comprising transistors MP12b and MN12b that is controlled by clock signal clkbr is coupled to the second terminal of capacitor C6b.

Figure 7:
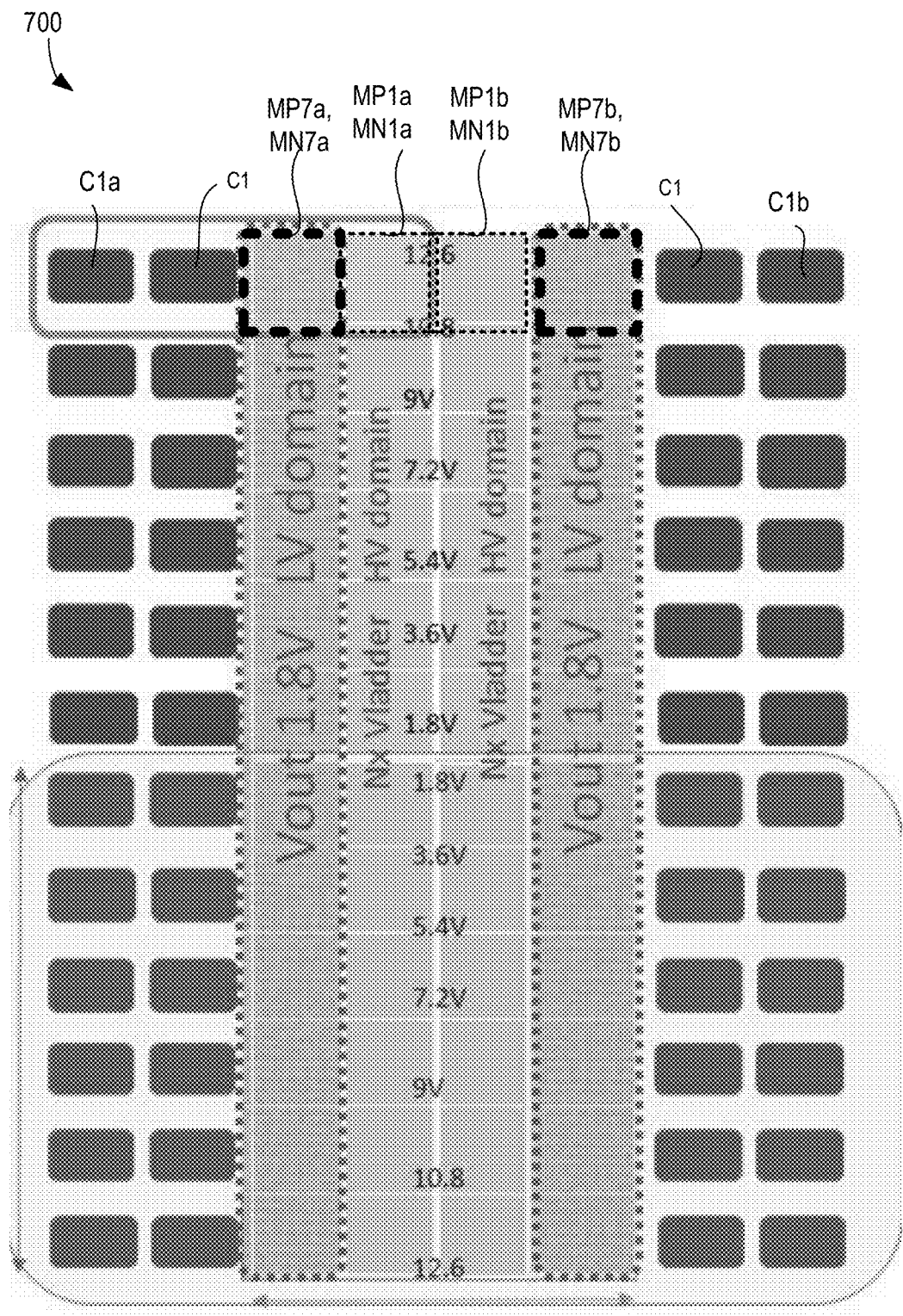
FIG. 7 illustrates a matched layout of the 7:1 resonant switched capacitor star topology of FIG. 6, in accordance with some embodiments.

FIG. 7 illustrates matched layout 700 of the 7:1 resonant switched capacitor star topology of FIG. 6 with four inter-linked phases, in accordance with some embodiments. Compared to layout 400, here capacitors and active devices result in small current loops yielding less interference and a more optimal layout. A unit size PMOS-NMOS pair along with its drivers is optimized in layout, which are then arrayed to form all the high voltage as well as the low voltage rungs. The well taps are biased to the highest voltage of the rung as shown resulting in a well-matched and symmetrical layout. A well-matched layout results in less device-to-device variations and more predictable results. Here, the layout is symmetrical along the middle which allows reuse of layout cells.

Figure 8:
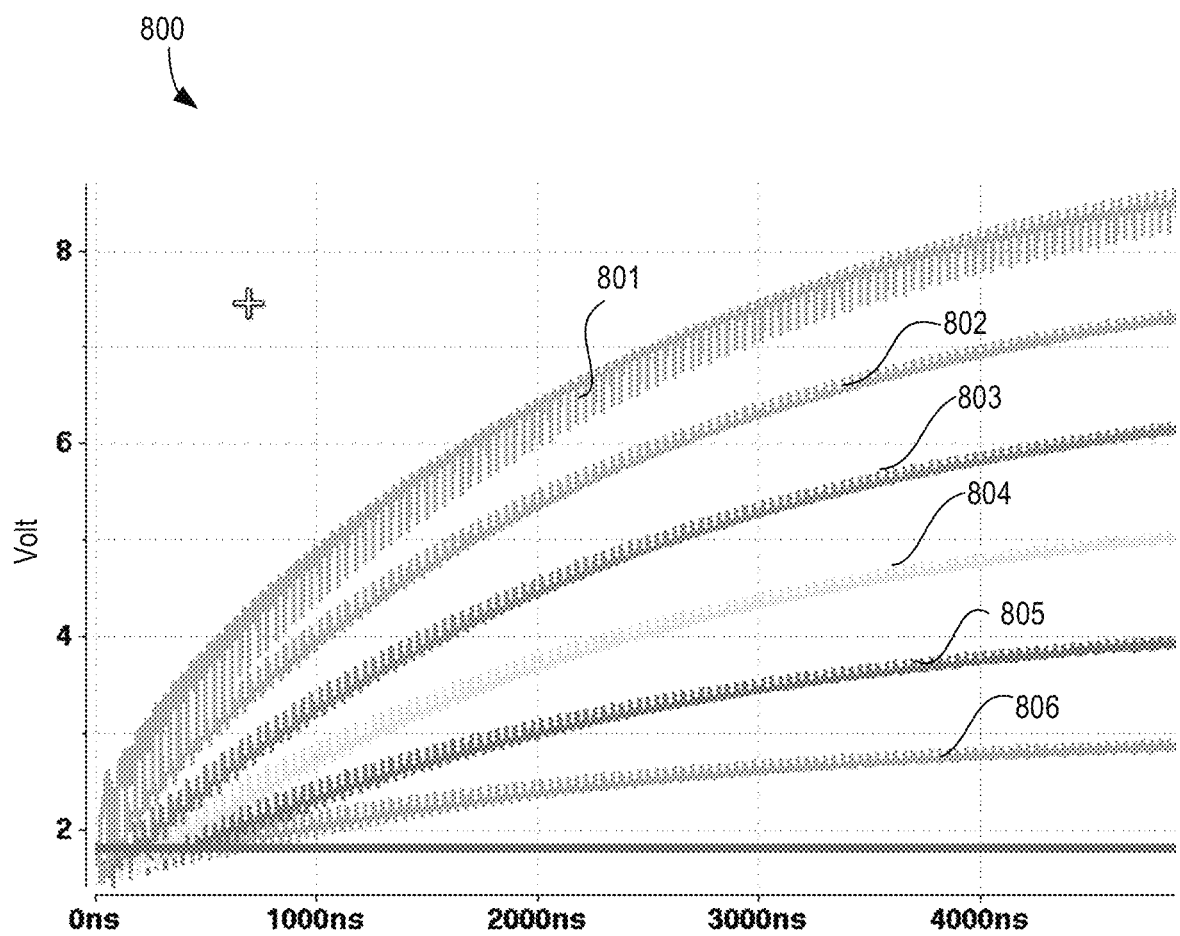
FIG. 8 illustrate a plot showing start-up operation and characteristics of the 7:1 resonant switched capacitor star topology, in accordance with some embodiments.

FIG. 8 illustrates plot 800 showing start-up operation and characteristics of the 7:1 resonant switched capacitor star topology, in accordance with some embodiments. Here, the x-axis is time and y-axis is voltage. A 1.8V I/O supply powers a startup scheme that charges all the node voltages, during which the input supply is power gated. Once the highest node has approached the input supply level within an acceptable limit, the input supply is applied. Plot 800 shows that each ladder section charges up its internal nodes without violating voltage limits for the transistors. Waveform 801 illustrates the voltage on capacitor node C1 of section $601_1$ coupled to second supply rail; waveform 802 illustrates the voltage on capacitor node C2 of section $601_2$ coupled to third supply rail; waveform 803 illustrates the voltage on capacitor node C3 of section $601_3$ coupled to fourth supply node; waveform 804 illustrates the voltage on capacitor node C4 of section $601_4$ coupled to fifth supply node; waveform 805 illustrates the voltage on capacitor node C5 of section $601_5$ coupled to the fifth power supply rail; and waveform 806 illustrates the voltage on capacitor node C6 of section $601_6$ coupled to the sixth power supply rail. Here, startup of the circuit uses 1.8V power supply.

Figure 9:
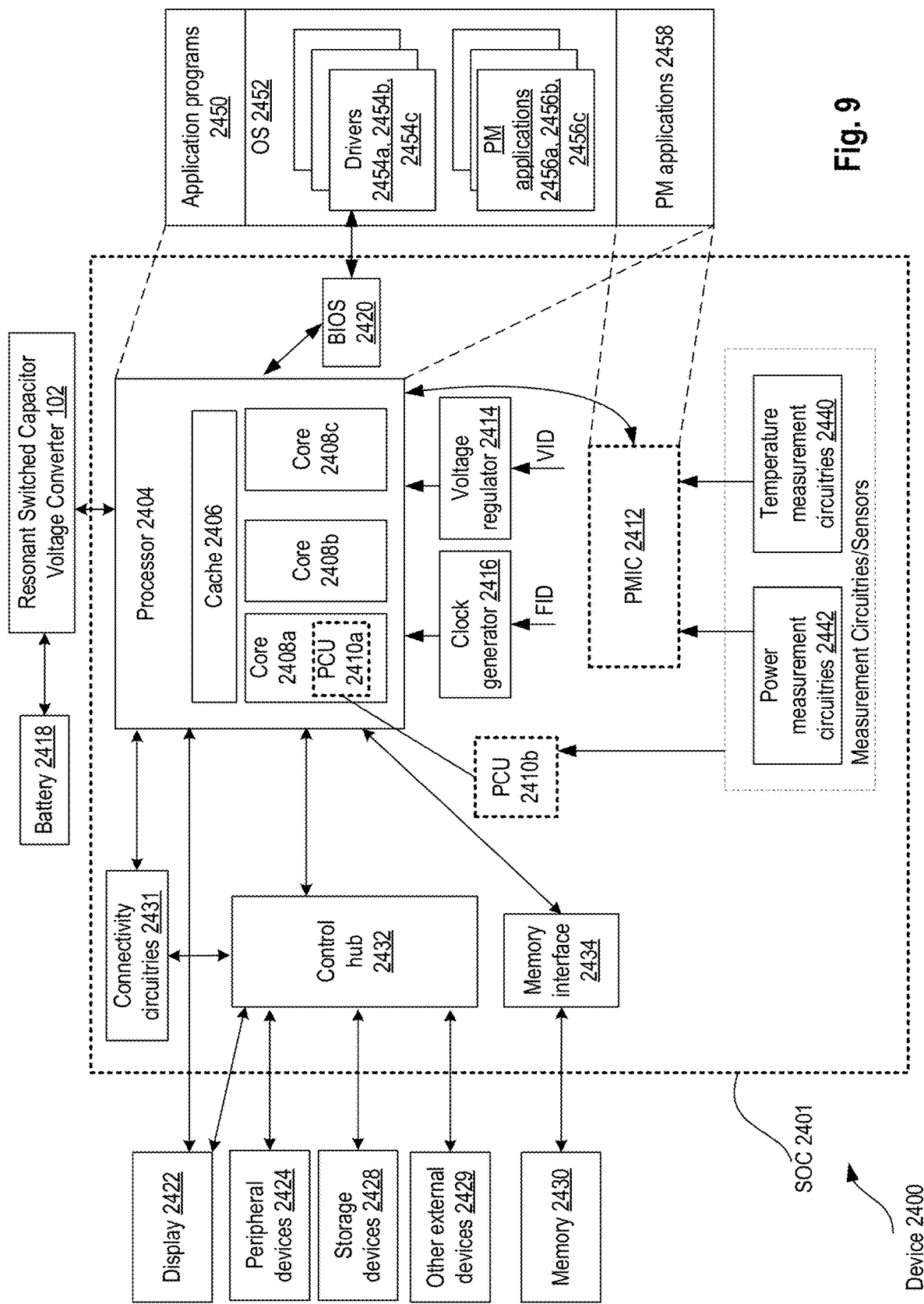
FIG. 9 illustrates a smart device or a computer system or a SoC (System-on-Chip) that receives power from the high-bandwidth resonant switched capacitor VR, according to some embodiments of the disclosure.

FIG. 9 illustrates a smart device or a computer system or a SoC (System-on-Chip) that receives power from the high-bandwidth resonant switched capacitor VR, according to some embodiments of the disclosure. It is pointed out that those elements of FIG. 9 having the same reference numbers (or names) as the elements of any other figure can operate or function in any manner similar to that described, but are not limited to such.

In some embodiments, device 2400 represents an appropriate computing device, such as a computing tablet, a mobile phone or smart-phone, a laptop, a desktop, an Internet-of-Things (IOT) device, a server, a wearable device, a set-top box, a wireless-enabled e-reader, or the like. It will be understood that certain components are shown generally, and not all components of such a device are shown in device 2400.

In an example, the device 2400 comprises a SoC (System-on-Chip) 2401. An example boundary of the SOC 2401 is illustrated using dotted lines in FIG. 9, with some example components being illustrated to be included within SOC 2401—however, SOC 2401 may include any appropriate components of device 2400.

In some embodiments, device 2400 includes processor 2404. Processor 2404 can include one or more physical devices, such as microprocessors, application processors, microcontrollers, programmable logic devices, processing cores, or other processing means. The processing operations performed by processor 2404 include the execution of an operating platform or operating system on which applications and/or device functions are executed. The processing operations include operations related to I/O (input/output) with a human user or with other devices, operations related to power management, operations related to connecting computing device 2400 to another device, and/or the like. The processing operations may also include operations related to audio I/O and/or display I/O.

In some embodiments, processor 2404 includes multiple processing cores (also referred to as cores) 2408*a*, 2408*b*, 2408*c*. Although merely three cores 2408*a*, 2408*b*, 2408*c* are illustrated in FIG. 9, processor 2404 may include any other appropriate number of processing cores, e.g., tens, or even hundreds of processing cores. Processor cores 2408*a*, 2408*b*, 2408*c* may be implemented on a single integrated circuit (IC) chip. Moreover, the chip may include one or more shared and/or private caches, buses or interconnections, graphics and/or memory controllers, or other components.

In some embodiments, processor 2404 includes cache 2406. In an example, sections of cache 2406 may be dedicated to individual cores 2408 (e.g., a first section of cache 2406 dedicated to core 2408*a*, a second section of cache 2406 dedicated to core 2408*b*, and so on). In an example, one or more sections of cache 2406 may be shared among two or more of cores 2408. Cache 2406 may be split in different levels, e.g., level 1 (L1) cache, level 2 (L2) cache, level 3 (L3) cache, etc.

In some embodiments, processor core 2404 may include a fetch unit to fetch instructions (including instructions with conditional branches) for execution by the core 2404. The instructions may be fetched from any storage devices such as the memory 2430. Processor core 2404 may also include a decode unit to decode the fetched instruction. For example, the decode unit may decode the fetched instruction into a plurality of micro-operations. Processor core 2404 may include a schedule unit to perform various operations associated with storing decoded instructions. For example, the schedule unit may hold data from the decode unit until the instructions are ready for dispatch, e.g., until all source values of a decoded instruction become available. In one embodiment, the schedule unit may schedule and/or issue (or dispatch) decoded instructions to an execution unit for execution.

The execution unit may execute the dispatched instructions after they are decoded (e.g., by the decode unit) and dispatched (e.g., by the schedule unit). In an embodiment, the execution unit may include more than one execution unit (such as an imaging computational unit, a graphics computational unit, a general-purpose computational unit, etc.). The execution unit may also perform various arithmetic operations such as addition, subtraction, multiplication, and/or division, and may include one or more an arithmetic logic units (ALUs). In an embodiment, a co-processor (not shown) may perform various arithmetic operations in conjunction with the execution unit.

Further, execution unit may execute instructions out-of-order. Hence, processor core 2404 may be an out-of-order processor core in one embodiment. Processor core 2404 may also include a retirement unit. The retirement unit may retire executed instructions after they are committed. In an embodiment, retirement of the executed instructions may result in processor state being committed from the execution of the instructions, physical registers used by the instructions being de-allocated, etc. Processor core 2404 may also include a bus unit to enable communication between components of processor core 2404 and other components via one or more buses. Processor core 2404 may also include one or more registers to store data accessed by various components of the core 2404 (such as values related to assigned app priorities and/or sub-system states (modes) association.

In some embodiments, device 2400 comprises connectivity circuitries 2431. For example, connectivity circuitries 2431 includes hardware devices (e.g., wireless and/or wired connectors and communication hardware) and/or software components (e.g., drivers, protocol stacks), e.g., to enable device 2400 to communicate with external devices. Device 2400 may be separate from the external devices, such as other computing devices, wireless access points or base stations, etc.

In an example, connectivity circuitries 2431 may include multiple different types of connectivity. To generalize, the connectivity circuitries 2431 may include cellular connectivity circuitries, wireless connectivity circuitries, etc. Cellular connectivity circuitries of connectivity circuitries 2431 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, 3rd Generation Partnership Project (3GPP) Universal Mobile Telecommunications Systems (UMTS) system or variations or derivatives, 3GPP Long-Term Evolution (LTE) system or variations or derivatives, 3GPP LTE-Advanced (LTE-A) system or variations or derivatives, Fifth Generation (5G) wireless system or variations or derivatives, 5G mobile networks system or variations or derivatives, 5G New Radio (NR) system or variations or derivatives, or other cellular service standards. Wireless connectivity circuitries (or wireless interface) of the connectivity circuitries 2431 refers to wireless connectivity that is not cellular, and can include personal area networks (such as Bluetooth, Near Field, etc.), local area networks (such as Wi-Fi), and/or wide area networks (such as WiMax), and/or other wireless communication. In an example, connectivity circuitries 2431 may include a network interface, such as a wired or wireless interface, e.g., so that a system embodiment may be incorporated into a wireless device, for example, cell phone or personal digital assistant.

In some embodiments, device 2400 comprises control hub 2432, which represents hardware devices and/or software components related to interaction with one or more I/O devices. For example, processor 2404 may communicate with one or more of display 2422, one or more peripheral devices 2424, storage devices 2428, one or more other external devices 2429, etc., via control hub 2432. Control hub 2432 may be a chipset, a Platform Control Hub (PCH), and/or the like.

For example, control hub 2432 illustrates one or more connection points for additional devices that connect to device 2400, e.g., through which a user might interact with the system. For example, devices (e.g., devices 2429) that can be attached to device 2400 include microphone devices, speaker or stereo systems, audio devices, video systems or other display devices, keyboard or keypad devices, or other I/O devices for use with specific applications such as card readers or other devices.

As mentioned above, control hub 2432 can interact with audio devices, display 2422, etc. For example, input through a microphone or other audio device can provide input or commands for one or more applications or functions of device 2400. Additionally, audio output can be provided instead of, or in addition to display output. In another example, if display 2422 includes a touch screen, display 2422 also acts as an input device, which can be at least partially managed by control hub 2432. There can also be additional buttons or switches on computing device 2400 to provide I/O functions managed by control hub 2432. In one embodiment, control hub 2432 manages devices such as accelerometers, cameras, light sensors or other environmental sensors, or other hardware that can be included in device 2400. The input can be part of direct user interaction, as well as providing environmental input to the system to influence its operations (such as filtering for noise, adjusting displays for brightness detection, applying a flash for a camera, or other features).

In some embodiments, control hub 2432 may couple to various devices using any appropriate communication protocol, e.g., PCIe (Peripheral Component Interconnect Express), USB (Universal Serial Bus), Thunderbolt, High Definition Multimedia Interface (HDMI), Firewire, etc.

In some embodiments, display 2422 represents hardware (e.g., display devices) and software (e.g., drivers) components that provide a visual and/or tactile display for a user to interact with device 2400. Display 2422 may include a display interface, a display screen, and/or hardware device used to provide a display to a user. In some embodiments, display 2422 includes a touch screen (or touch pad) device that provides both output and input to a user. In an example, display 2422 may communicate directly with the processor 2404. Display 2422 can be one or more of an internal display device, as in a mobile electronic device or a laptop device or an external display device attached via a display interface (e.g., DisplayPort, etc.). In one embodiment display 2422 can be a head mounted display (HMD) such as a stereoscopic display device for use in virtual reality (VR) applications or augmented reality (AR) applications.

In some embodiments and although not illustrated in the figure, in addition to (or instead of) processor 2404, device 2400 may include Graphics Processing Unit (GPU) comprising one or more graphics processing cores, which may control one or more aspects of displaying contents on display 2422.

Control hub 2432 (or platform controller hub) may include hardware interfaces and connectors, as well as software components (e.g., drivers, protocol stacks) to make peripheral connections, e.g., to peripheral devices 2424.

It will be understood that device 2400 could both be a peripheral device to other computing devices, as well as have peripheral devices connected to it. Device 2400 may have a "docking" connector to connect to other computing devices for purposes such as managing (e.g., downloading and/or uploading, changing, synchronizing) content on device 2400. Additionally, a docking connector can allow device 2400 to connect to certain peripherals that allow computing device 2400 to control content output, for example, to audiovisual or other systems.

In addition to a proprietary docking connector or other proprietary connection hardware, device 2400 can make peripheral connections via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

In some embodiments, connectivity circuitries 2431 may be coupled to control hub 2432, e.g., in addition to, or instead of, being coupled directly to the processor 2404. In some embodiments, display 2422 may be coupled to control hub 2432, e.g., in addition to, or instead of, being coupled directly to processor 2404.

In some embodiments, device 2400 comprises memory 2430 coupled to processor 2404 via memory interface 2434. Memory 2430 includes memory devices for storing information in device 2400.

In some embodiments, memory 2430 includes apparatus to maintain stable clocking as described with reference to various embodiments. Memory can include nonvolatile (state does not change if power to the memory device is interrupted) and/or volatile (state is indeterminate if power to the memory device is interrupted) memory devices. Memory device 2430 can be a dynamic random access memory (DRAM) device, a static random access memory (SRAM) device, flash memory device, phase-change memory device, or some other memory device having suitable performance to serve as process memory. In one embodiment, memory 2430 can operate as system memory for device 2400, to store data and instructions for use when the one or more processors 2404 executes an application or process. Memory 2430 can store application data, user data, music, photos, documents, or other data, as well as system data (whether long-term or temporary) related to the execution of the applications and functions of device 2400.

Elements of various embodiments and examples are also provided as a machine-readable medium (e.g., memory 2430) for storing the computer-executable instructions (e.g., instructions to implement any other processes discussed herein). The machine-readable medium (e.g., memory 2430) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

In some embodiments, device 2400 comprises temperature measurement circuitries 2440, e.g., for measuring temperature of various components of device 2400. In an example, temperature measurement circuitries 2440 may be embedded, or coupled or attached to various components, whose temperature are to be measured and monitored. For example, temperature measurement circuitries 2440 may measure temperature of (or within) one or more of cores 2408*a*, 2408*b*, 2408*c*, voltage regulator 2414, memory 2430, a mother-board of SOC 2401, and/or any appropriate component of device 2400.

In some embodiments, device 2400 comprises power measurement circuitries 2442, e.g., for measuring power consumed by one or more components of the device 2400. In an example, in addition to, or instead of, measuring power, the power measurement circuitries 2442 may measure voltage and/or current. In an example, the power measurement circuitries 2442 may be embedded, or coupled or attached to various components, whose power, voltage, and/or current consumption are to be measured and monitored. For example, power measurement circuitries 2442 may measure power, current and/or voltage supplied by one or more voltage regulators 2414, power supplied to SOC 2401, power supplied to device 2400, power consumed by processor 2404 (or any other component) of device 2400, etc.

In some embodiments, device 2400 comprises one or more voltage regulator circuitries, generally referred to as voltage regulator (VR) 2414. VR 2414 generates signals at appropriate voltage levels, which may be supplied to operate any appropriate components of the device 2400. Merely as an example, VR 2414 is illustrated to be supplying signals to processor 2404 of device 2400. In some embodiments, VR 2414 receives one or more Voltage Identification (VID) signals, and generates the voltage signal at an appropriate level, based on the VID signals. Various type of VRs may be utilized for the VR 2414. For example, VR 2414 may include a "buck" VR, "boost" VR, a combination of buck and boost VRs, low dropout (LDO) regulators, switching DC-DC regulators, etc. Buck VR is generally used in power delivery applications in which an input voltage needs to be transformed to an output voltage in a ratio that is smaller than unity. Boost VR is generally used in power delivery applications in which an input voltage needs to be transformed to an output voltage in a ratio that is larger than unity. In some embodiments, each processor core has its own VR, which is controlled by PCU 2410*a/b* and/or PMIC 2412. In some embodiments, each core has a network of distributed LDOs to provide efficient control for power management. The LDOs can be digital, analog, or a combination of digital or analog LDOs.

Each voltage regulator of device 2400 receives an input supply Vin and generates a regulated power supply voltage for a specific power domain. In various embodiments, the input supply Vin is generated by the N:1 star topology 102 (e.g., 200, 600) that receives a high voltage (e.g., 12.6) from an external source such as battery 2418.

In some embodiments, device 2400 comprises one or more clock generator circuitries, generally referred to as clock generator 2416. Clock generator 2416 generates clock signals at appropriate frequency levels, which may be supplied to any appropriate components of device 2400. Merely as an example, clock generator 2416 is illustrated to be supplying clock signals to processor 2404 of device 2400. In some embodiments, clock generator 2416 receives one or more Frequency Identification (FID) signals, and generates the clock signals at an appropriate frequency, based on the FID signals.

In some embodiments, device 2400 comprises battery 2418 supplying power to various components of device 2400 via converter 102. Merely as an example, battery 2418 is illustrated to be supplying power to processor 2404 via converter 102. Although not illustrated in the figures, device 2400 may comprise a charging circuitry, e.g., to recharge the battery, based on Alternating Current (AC) power supply received from an AC adapter.

In some embodiments, device 2400 comprises Power Control Unit (PCU) 2410 (also referred to as Power Management Unit (PMU), Power Controller, etc.). In an example, some sections of PCU 2410 may be implemented by one or more processing cores 2408, and these sections of PCU 2410 are symbolically illustrated using a dotted box and labelled PCU 2410*a*. In an example, some other sections of PCU 2410 may be implemented outside the processing cores 2408, and these sections of PCU 2410 are symbolically illustrated using a dotted box and labelled as PCU 2410*b*. PCU 2410 may implement various power management operations for device 2400. PCU 2410 may include hardware interfaces, hardware circuitries, connectors, registers, etc., as well as software components (e.g., drivers, protocol stacks), to implement various power management operations for device 2400.

In some embodiments, device 2400 comprises Power Management Integrated Circuit (PMIC) 2412, e.g., to implement various power management operations for device 2400. In some embodiments, PMIC 2412 is a Reconfigurable Power Management ICs (RPMICs) and/or an IMVP (Intel® Mobile Voltage Positioning). In an example, the PMIC is within an IC chip separate from processor 2404. The may implement various power management operations for device 2400. PMIC 2412 may include hardware interfaces, hardware circuitries, connectors, registers, etc., as well as software components (e.g., drivers, protocol stacks), to implement various power management operations for device 2400.

In an example, device 2400 comprises one or both PCU 2410 or PMIC 2412. In an example, any one of PCU 2410 or PMIC 2412 may be absent in device 2400, and hence, these components are illustrated using dotted lines.

Various power management operations of device 2400 may be performed by PCU 2410, by PMIC 2412, or by a combination of PCU 2410 and PMIC 2412. For example, PCU 2410 and/or PMIC 2412 may select a power state (e.g., P-state) for various components of device 2400. For example, PCU 2410 and/or PMIC 2412 may select a power state (e.g., in accordance with the ACPI (Advanced Configuration and Power Interface) specification) for various components of device 2400. Merely as an example, PCU 2410 and/or PMIC 2412 may cause various components of the device 2400 to transition to a sleep state, to an active state, to an appropriate C state (e.g., C0 state, or another appropriate C state, in accordance with the ACPI specification), etc. In an example, PCU 2410 and/or PMIC 2412 may control a voltage output by VR 2414 and/or a frequency of a clock signal output by the clock generator, e.g., by outputting the VID signal and/or the FID signal, respectively. In an example, PCU 2410 and/or PMIC 2412 may control battery power usage, charging of battery 2418, and features related to power saving operation.

The clock generator 2416 can comprise a phase locked loop (PLL), frequency locked loop (FLL), or any suitable clock source. In some embodiments, each core of processor 2404 has its own clock source. As such, each core can operate at a frequency independent of the frequency of operation of the other core. In some embodiments, PCU 2410 and/or PMIC 2412 performs adaptive or dynamic frequency scaling or adjustment. For example, clock frequency of a processor core can be increased if the core is not operating at its maximum power consumption threshold or limit. In some embodiments, PCU 2410 and/or PMIC 2412 determines the operating condition of each core of a processor, and opportunistically adjusts frequency and/or power supply voltage of that core without the core clocking source (e.g., PLL of that core) losing lock when the PCU 2410 and/or PMIC 2412 determines that the core is operating below a target performance level. For example, if a core is drawing current from a power supply rail less than a total current allocated for that core or processor 2404, then PCU 2410 and/or PMIC 2412 can temporality increase the power draw for that core or processor 2404 (e.g., by increasing clock frequency and/or power supply voltage level) so that the core or processor 2404 can perform at higher performance level. As such, voltage and/or frequency can be increased temporality for processor 2404 without violating product reliability.

In an example, PCU 2410 and/or PMIC 2412 may perform power management operations, e.g., based at least in part on receiving measurements from power measurement circuitries 2442, temperature measurement circuitries 2440, charge level of battery 2418, and/or any other appropriate information that may be used for power management. To that end, PMIC 2412 is communicatively coupled to one or more sensors to sense/detect various values/variations in one or more factors having an effect on power/thermal behavior of the system/platform. Examples of the one or more factors include electrical current, voltage droop, temperature, operating frequency, operating voltage, power consumption, inter-core communication activity, etc. One or more of these sensors may be provided in physical proximity (and/or thermal contact/coupling) with one or more components or logic/IP blocks of a computing system. Additionally, sensor(s) may be directly coupled to PCU 2410 and/or PMIC 2412 in at least one embodiment to allow PCU 2410 and/or PMIC 2412 to manage processor core energy at least in part based on value(s) detected by one or more of the sensors.

Also illustrated is an example software stack of device 2400 (although not all elements of the software stack are illustrated). Merely as an example, processors 2404 may execute application programs 2450, Operating System 2452, one or more Power Management (PM) specific application programs (e.g., generically referred to as PM applications 2458), and/or the like. PM applications 2458 may also be executed by the PCU 2410 and/or PMIC 2412. OS 2452 may also include one or more PM applications 2456*a*, 2456*b*, 2456*c*. The OS 2452 may also include various drivers 2454*a*, 2454*b*, 2454*c*, etc., some of which may be specific for power management purposes. In some embodiments, device 2400 may further comprise a Basic Input/Output System (BIOS) 2420. BIOS 2420 may communicate with OS 2452 (e.g., via one or more drivers 2454), communicate with processors 2404, etc.

For example, one or more of PM applications 2458, 2456, drivers 2454, BIOS 2420, etc. may be used to implement power management specific tasks, e.g., to control voltage and/or frequency of various components of device 2400, to control wake-up state, sleep state, and/or any other appropriate power state of various components of device 2400, control battery power usage, charging of the battery 2418, features related to power saving operation, etc.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well-known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

Following examples are provided to illustrate the various embodiments. These examples can depend from one another in any suitable manner.

EXAMPLE 1

An apparatus comprising: a chain of at least four circuitries coupled in series, wherein each circuitries of the chain comprises: first and second inverters coupled in parallel between a first power supply rail and a second power supply rail, wherein the first inverter is to receive a first clock, wherein the second inverter is to receive a second clock which is an inverse of the first clock, wherein the first and second clocks are to toggle between voltages of the first and second power supply rails; and a capacitor coupled to the first and second power supply rails; a receiver circuitry coupled to a last circuitry of the chain, wherein the receiver circuitry comprises: first and second inverters coupled in parallel between the second power supply of a last circuitry of the chain and ground; and a capacitor coupled to the second power supply of the last circuitry of the chain and ground; and a level-shifter coupled to the chain, wherein the level-shifter is to receive an input clock and to generate the first and second clocks from the input clock.

EXAMPLE 2

The apparatus of example 1, wherein an output of the first inverter and an output of the second inverter of each circuitry of the chain is coupled to a first capacitor and a second capacitor, respectively.

EXAMPLE 3

The apparatus of example 2, wherein an output of the first inverter and an output of the second inverter of the receiver circuitry is coupled to the first and second capacitors of each circuitry of the chain.

EXAMPLE 4

The apparatus of example 1, wherein the first inverter of the receiver circuitry is to receive a third clock, wherein the second inverter of the receiver is to receive a fourth clock which is inverse of the third clock, wherein the third and fourth clocks are to toggle between voltages of the second power supply of a last circuitry of the chain and ground.

EXAMPLE 5

The apparatus of example 4, wherein phases of the third and fourth clocks are adjustable relative to phases of the first and second clocks.

EXAMPLE 6

The apparatus of example 5 comprises a controller to control phases of the third and fourth clocks to regulate an output power supply.

EXAMPLE 7

The apparatus of example 1, wherein the capacitor of each circuitry of the chain is positioned off-die, and wherein the capacitor of the receiver circuitry is positioned off-die.

EXAMPLE 8

An apparatus comprising: a chain of at least four circuitries coupled in series, wherein each circuitries of the chain comprises: first and second inverters coupled in parallel between a first power supply rail and a second power supply rail, wherein the first inverter is to receive a first clock, wherein the second inverter is to receive a second clock which is an inverse of the first clock, wherein the first and second clocks are to toggle between voltages of the first and second power supply rails; and a capacitor coupled to the first and second power supply rails; a first set of inverters coupled between the second power supply of a last circuitry of the chain and ground, wherein each inverter of the first set of inverters is coupled to a corresponding first inverter of a circuitry of the chain via a first capacitor; and a second set of inverters coupled between the second power supply of a last circuitry of the chain and ground, wherein each inverter of the second set of inverters is coupled to the second inverter of corresponding a circuitry of the chain via a second capacitor.

EXAMPLE 9

The apparatus of example 8, wherein each inverter of the first set is to receive a third clock, wherein each inverter of the second set is to receive a fourth clock which is an inverse of the third clock, wherein the third and fourth clocks are to toggle between voltages of the second power supply of a last circuitry of the chain and ground.

EXAMPLE 10

The apparatus of example 9, wherein phases of the third and fourth clocks are adjustable relative to phases of the first and second clocks.

EXAMPLE 11

The apparatus of example 10 comprises a controller to control phases of the third and fourth clocks to regulate an output power supply.

EXAMPLE 12

The apparatus of example 8 comprises a level-shifter coupled to the chain, wherein the level-shifter is to receive an input clock and to generate the first and second clocks from the input clock.

EXAMPLE 13

A system comprising: a battery or a power supply; a first voltage regulator comprising: a chain of at least four circuitries coupled in series, wherein each circuitries of the chain comprises: first and second inverters coupled in parallel between a first power supply rail and a second power supply rail, wherein the first inverter is to receive a first clock, wherein the second inverter is to receive a second clock which is an inverse of the first clock, wherein the first and second clocks are to toggle between voltages of the first and second power supply rails; and a capacitor coupled to the first and second power supply rails; a first set of inverters coupled between the second power supply of a last circuitry of the chain and ground, wherein each inverter of the first set of inverters is coupled to a corresponding first inverter of a circuitry of the chain via a first capacitor; and a second set of inverters coupled between the second power supply of a last circuitry of the chain and ground, wherein each inverter of the second set of inverters is coupled to the second inverter of corresponding a circuitry of the chain via a second capacitor; a processor coupled to an output of the first voltage regulator, wherein the first voltage regulator is to provide a regulated input power supply to the processor; and a memory coupled to the processor.

EXAMPLE 14

The system of example 13, wherein the processor includes a voltage regulator or a low dropout regulator that receive the regulated input power supply from the first voltage regulator.

EXAMPLE 15

The system of example 13, wherein each inverter of the first set is to receive a third clock, wherein each inverter of the second set is to receive a fourth clock which is an inverse of the third clock, wherein the third and fourth clocks are to toggle between voltages of the second power supply of a last circuitry of the chain and ground.

EXAMPLE 16

The system of example 15, wherein phases of the third and fourth clocks are adjustable relative to phases of the first and second clocks.

EXAMPLE 17

The system of example 15 comprises a controller to control phases of the third and fourth clocks to regulate an output power supply.

EXAMPLE 18

The system of example 13, wherein the first voltage regulator comprises a level-shifter coupled to the chain, wherein the level-shifter is to receive an input clock and to generate the first and second clocks from the input clock.

EXAMPLE 19

An apparatus comprising: a first chain of p-type and n-type devices coupled in series, wherein the first chain comprises four p-type and four-type devices, wherein a first p-type device of the first chain is coupled to a first power supply rail, and wherein a last n-type device of the first chain is coupled to a second power supply rail; a second chain of p-type and n-type devices coupled in series, wherein the second chain comprises four p-type and four-type devices, wherein a first p-type device of the second chain is coupled to the first power supply rail, and wherein a last n-type device of the second chain is coupled to the second power supply rail; and a receiver coupled to the second power supply rail and ground, wherein the receiver comprises: a first inverter coupled to the last n-type device of the first chain; and a second inverter coupled to the last n-type device of the second chain.

EXAMPLE 20

The apparatus of example 19, wherein the first chain comprises: a first inverter comprising the first p-type device and a first n-type device coupled in series with the first p-type device; and a second inverter comprising the second p-type device and a second n-type device coupled in series with the second p-type device, wherein the first n-type device of the first chain is coupled to the second p-type device of the second chain at a third power supply rail.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

What is claimed is:

1. An apparatus comprising:
   a chain of at least four circuitries coupled in series, wherein each circuitry of the chain comprises:
      first and second inverters coupled in parallel between a first power supply rail and a second power supply rail, wherein the first inverter is to receive a first clock, wherein the second inverter is to receive a second clock which is an inverse of the first clock, and wherein the first and second clocks are to toggle between voltages of the first and second power supply rails; and
      a capacitor coupled to the first and second power supply rails;
   a first set of inverters coupled between the second power supply rail of a last circuitry of the chain and ground, wherein each inverter of the first set of inverters is coupled to a corresponding first inverter of a circuitry of the chain via a first capacitor; and
   a second set of inverters coupled between the second power supply rail of a last circuitry of the chain and ground, wherein each inverter of the second set of inverters is coupled to the second inverter of the corresponding circuitry of the chain via a second capacitor.

2. The apparatus of claim 1, wherein each inverter of the first set is to receive a third clock, wherein each inverter of the second set is to receive a fourth clock which is an inverse of the third clock, wherein the third and fourth clocks are to toggle between voltages of the second power supply of a last circuitry of the chain and ground.

3. The apparatus of claim 2, wherein phases of the third and fourth clocks are adjustable relative to phases of the first and second clocks.

4. The apparatus of claim 3, further comprising a controller to control phases of the third and fourth clocks to regulate an output power supply.

5. The apparatus of claim 1, further comprising a level-shifter coupled to the chain, wherein the level-shifter is to receive an input clock and to generate the first and second clocks from the input clock.

6. A system comprising:
   a battery or a power supply;
   a first voltage regulator comprising:
      a chain of at least four circuitries coupled in series, wherein each circuitry of the chain comprises:
         first and second inverters coupled in parallel between a first power supply rail and a second power supply rail, wherein the first inverter is to receive a first clock, wherein the second inverter is to receive a second clock which is an inverse of the first clock, wherein the first and second clocks are to toggle between voltages of the first and second power supply rails; and
         a capacitor coupled to the first and second power supply rails; a first set of inverters coupled between the second power supply of a last circuitry of the chain and ground, wherein each inverter of the first set of inverters is coupled to a corresponding first inverter of a circuitry of the chain via a first capacitor; and
         a second set of inverters coupled between the second power supply of a last circuitry of the chain and ground, wherein each inverter of the second set of inverters is coupled to the second inverter of a corresponding circuitry of the chain via a second capacitor;
   a processor coupled to an output of the first voltage regulator, wherein the first voltage regulator is to provide a regulated input power supply to the processor; and
   a memory coupled to the processor.

7. The system of claim 6, wherein the processor includes a voltage regulator or a low dropout regulator that receive the regulated input power supply from the first voltage regulator.

8. The system of claim 6, wherein each inverter of the first set is to receive a third clock, wherein each inverter of the second set is to receive a fourth clock which is an inverse of the third clock, and wherein the third and fourth clocks are to toggle between voltages of the second power supply of a last circuitry of the chain and ground.

9. The system of claim 8, wherein phases of the third and fourth clocks are adjustable relative to phases of the first and second clocks.

10. The system of claim 8, further comprising a controller to control phases of the third and fourth clocks to regulate an output power supply.

11. The system of claim 6, wherein the first voltage regulator comprises a level-shifter coupled to the chain, and wherein the level-shifter is to receive an input clock and to generate the first and second clocks from the input clock.

* * * * *